United States Patent
Toda

(10) Patent No.: US 8,674,736 B2
(45) Date of Patent: Mar. 18, 2014

(54) CLOCK SYNCHRONIZATION CIRCUIT

(75) Inventor: Asako Toda, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/563,530

(22) Filed: Jul. 31, 2012

(65) Prior Publication Data
US 2014/0035636 A1 Feb. 6, 2014

(51) Int. Cl.
*H03L 7/00* (2006.01)

(52) U.S. Cl.
USPC ............ 327/163; 375/373; 327/141; 327/144

(58) Field of Classification Search
CPC ......... H03K 5/133; H03K 5/135; H03K 5/14; H03L 7/00; G06F 1/04; G11C 7/222; G11C 7/225; G11C 7/227
USPC ......... 327/163, 99, 2, 407, 144, 3, 7, 12, 156, 327/141, 157–159, 161, 162, 152–154, 327/169; 375/371, 373, 375
See application file for complete search history.

(56) References Cited

U.S. PATENT DOCUMENTS

| | | | | |
|---|---|---|---|---|
| 4,368,987 A | | 1/1983 | Waters | |
| 7,170,963 B2 | * | 1/2007 | Cao | 375/373 |
| 7,443,214 B2 | * | 10/2008 | Kimura | 327/156 |
| 7,724,051 B2 | * | 5/2010 | Tomar et al. | 327/158 |
| 7,977,986 B2 | * | 7/2011 | Lee | 327/158 |
| 8,243,869 B2 | * | 8/2012 | Dvir et al. | 375/376 |
| 2005/0264327 A1 | * | 12/2005 | Isobe | 327/141 |

* cited by examiner

*Primary Examiner* — Lincoln Donovan
*Assistant Examiner* — Thomas Skibinski
(74) *Attorney, Agent, or Firm* — Maschoff Brennan

(57) ABSTRACT

A method of synchronizing clock signals may include generating a replicated delay associated with a delay of a clock signal path. The clock signal path may be associated with communication of a slave clock signal by a master block of a circuit to a slave block of the circuit. The method may further include selecting the slave clock signal from one of multiple clock signals based on the replicated delay. Each of the multiple clock signals may have a same frequency and a different phase.

20 Claims, 5 Drawing Sheets

CLOCK SYNCHRONIZATION CIRCUIT

FIELD

The embodiments discussed herein are related to synchronization of clock signals.

BACKGROUND

Electronic systems are becoming increasingly more complex and operate at clock rates that have increasingly higher speeds. As the complexities and clock rates of an electronic system increase, clock signals of the electronic system may experience substantial phase shifts as they travel from one block of the electronic system to another block of the electronic system. The differences in phase of the clock signals received by different blocks may lead to loss of data and errors.

Clock trees and delay-lock loops (DLLs) have been traditionally used to synchronize clock signals received by different blocks. However, clock trees and DLLs require a substantial amount of power and hardware to implement. Further, clock trees and DLLs may be difficult to implement.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a method of synchronizing clock signals may include generating a replicated delay associated with a delay of a clock signal path. The clock signal path may be associated with communication of a slave clock signal by a master block of a circuit to a slave block of the circuit. The method may further include selecting the slave clock signal from one of multiple clock signals based on the replicated delay. Each of the multiple clock signals may have a same frequency and a different phase.

The object and advantages of the embodiments will be realized and achieved at least by the elements, features, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Some embodiments of the present disclosure may include a circuit that may be configured to synchronize clock signals received by two or more blocks of an electronic system. As described in further detail below, the circuit may include a path replicator that is configured to replicate a delay associated with a clock signal path. The clock signal path may be associated with communication of a slave clock signal by a master block of the circuit to a slave block of the circuit. The path replicator may receive a reference clock signal and may output a delayed reference clock signal. The delayed reference clock signal may therefore have a phase shift with respect to the reference clock signal that is associated with the delay of the clock signal path between the master block and the slave block.

A phase detector of the circuit may be configured to receive the reference clock signal and the delayed reference clock signal. The phase detector may be configured to generate a control signal based on a phase difference between the reference clock signal and the delayed reference clock signal. The control signal may be received by a selector circuit that may select one of multiple clock signals as the slave clock signal based on the control signal. The multiple clock signals may have substantially the same frequency, but may have different phases. The clock signal selected as the slave clock signal may have a phase shift that may at least partially compensate for the delay of the clock signal path between the master block and the slave block. Therefore, the circuit may be configured to synchronize clock signals between the master block and the slave block.

Embodiments of the present disclosure will be explained with reference to the accompanying drawings.

Figure 1A:
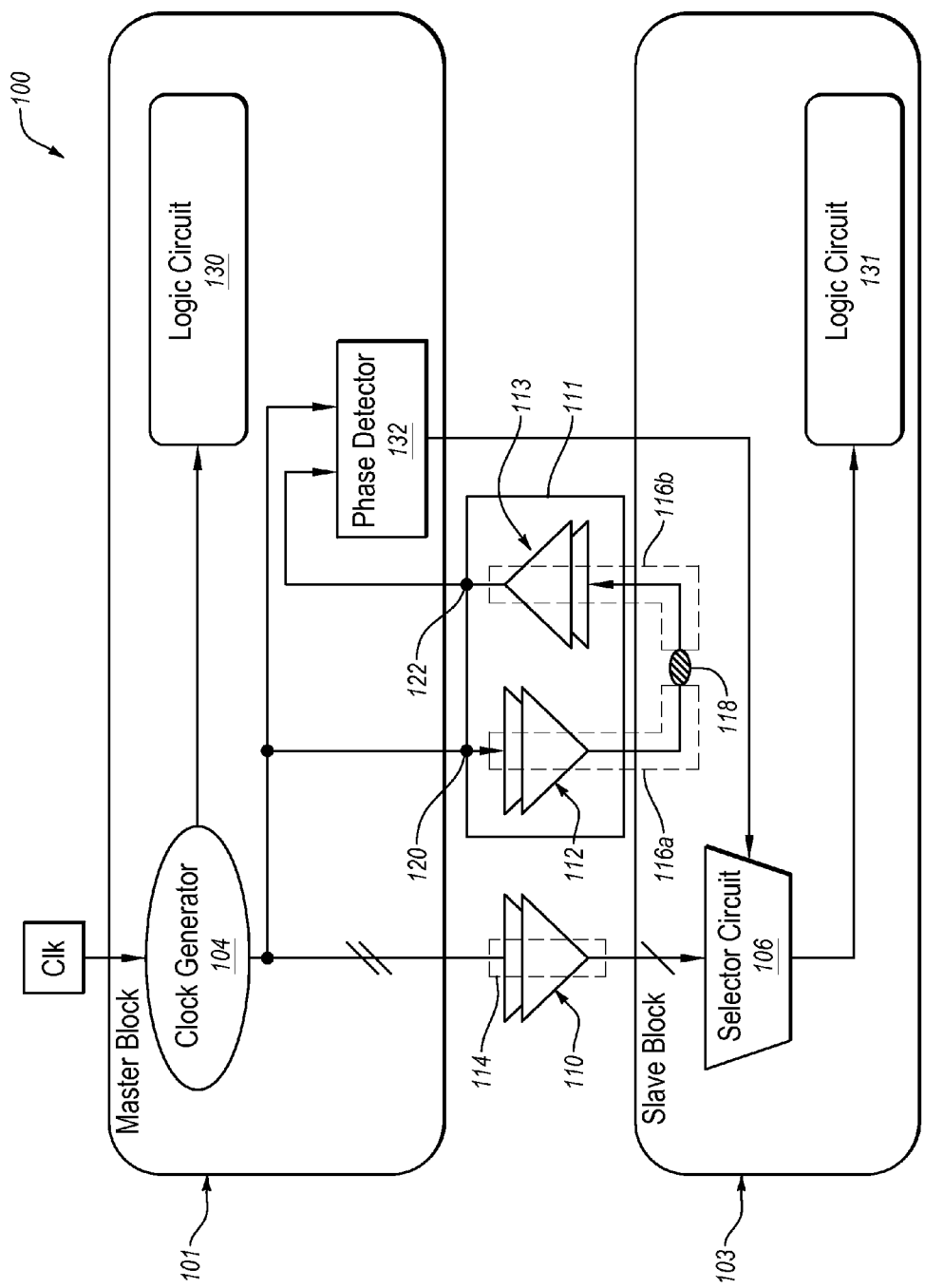
FIG. 1A illustrates an example embodiment of a circuit configured to synchronize clock signals.

FIG. 1A illustrates an example embodiment of a circuit 100 configured to synchronize clock signals, arranged in accordance with at least some embodiments described herein. The circuit 100 may include a master block 101, a slave block 103, a path replicator 111, a phase detector 132 and a selector circuit 106.

The master block 101 may include any system, apparatus, or device that may perform operations associated with the circuit 100. In the illustrated embodiment, the master block 101 may include a logic circuit 130 that may perform one or more operations of the master block 101. The logic circuit 130 may be driven by a master clock signal that may be associated with a clock signal received by the master block 101. The clock signal received by the master block 101 is depicted as "clk" in FIG. 1A and is referred to hereinafter as "the base clock signal."

The slave block 101 may also include any system, apparatus, or device that may perform operations associated with the circuit 100. In the illustrated embodiment, the slave block 103 may include a logic circuit 131 that may perform one or more operations of the slave block 103. The logic circuit 131 may be driven by a slave clock signal received from the master block 101 via a clock signal path 114. As explained in further detail, the circuit 100 may be configured to at least partially compensate for a delay associated with the clock signal path 114. The compensation for the delay may reduce a phase difference between the master clock signal and the slave clock signal—the phase difference may also be referred to as "phase error." Therefore, the master clock signal and the slave clock signal may be better synchronized.

In the illustrated embodiment, the master block 101 may include a clock generator 104 configured to receive the base clock signal. The clock generator 104 may be configured to generate multiple clock signals based on the base clock signal. Each of the clock signals generated by the clock generator 104 may have substantially the same frequency, but may have a different phase. In some embodiments the clock generator may include a phase interpolator.

Figure 1B:
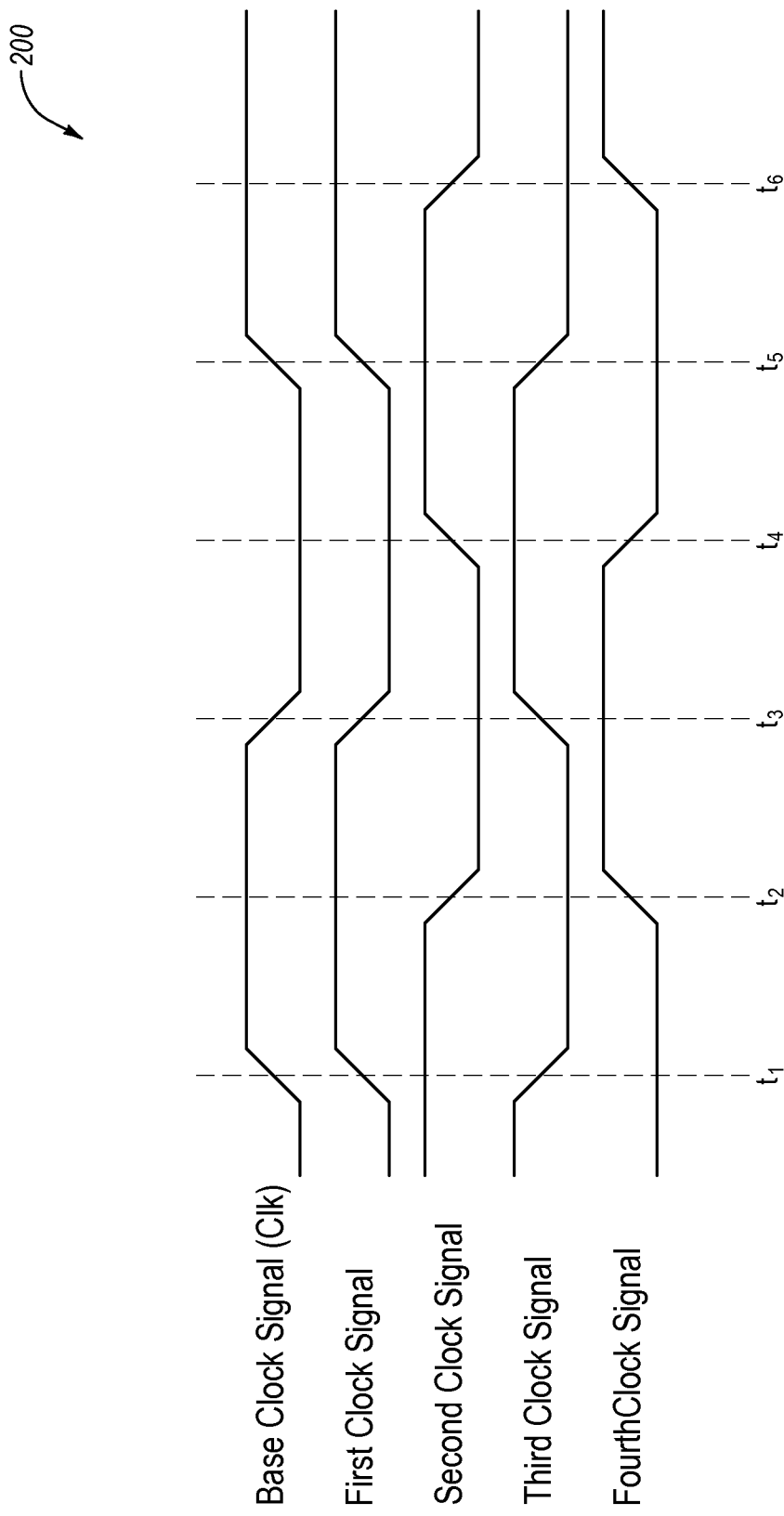
FIG. 1B illustrates an example timing diagram of clock signals that may be associated with the circuit of FIG. 1A.

For example, FIG. 1B illustrates an example timing diagram of the base clock signal and first, second, third, and fourth clock signals generated by the clock generator 104 based on the base clock signal. As depicted in FIG. 1B, the first, second, third, and fourth clock signals may have substantially the same frequency as the base clock signal. However, each of the first, second, third and fourth clock signals may have a different phase.

For example, in the illustrated embodiment of FIG. 1B, the first clock signal may have a zero degree (zero radian) phase shift with respect to the base clock signal. The second clock signal may have a negative ninety degree ($\pi/2$ radian) phase shift with respect to the base clock signal. The third clock signal may have a negative one-hundred eighty degree ($\pi$ radian) phase shift with respect to the base clock signal and the fourth clock signal may have a negative two-hundred seventy degree ($3\pi/2$ radian) phase shift with respect to the base clock signal. Although, FIG. 1B illustrates an example of four different clock signals having specific phase shifts, any number of clock signals having any degree of phase shifts may be generated by the clock generator 104 depending on the particular implementation of the circuit 100.

Returning to FIG. 1A, in some embodiments of the present disclosure, the clock generator 104 may be configured to communicate one of the multiple clock signals as the master clock signal to the logic circuit 130. For example, the clock generator 104 may communicate to the logic circuit 130 the first clock signal, which has a zero degree phase shift, as the master clock signal. In other embodiments, the logic circuit 130 may receive the base clock signal directly.

In the illustrated embodiment, the clock generator 104 may be configured to communicate the multiple clock signals to the selector circuit 106, which, in some embodiments of the present disclosure, may be included in the slave block 103. In other embodiments, the selector circuit 106 may be included in the master block 101. In the illustrated embodiment, the multiple clock signals may propagate from the clock generator 104 of the master block 101 to the selector circuit 106 of the slave block 103 via the clock signal path 114. In other embodiments (e.g., where the selector circuit 106 is included in the master block 101), the selector circuit 106 may select one of the multiple clock signals as the slave clock signal and the slave clock signal may propagate from the selector circuit 106 to the slave block 103 via the clock signal path 114.

The clock signal path 114 may include one or more delay elements 110. A delay element 110 may include any component of the circuit 100 that may be within the clock signal path 114 and that may delay the propagation of a clock signal through the clock signal path 114. For example, a delay element 110 may be a buffer included in the clock signal path 114. Further, in some embodiments, the clock signal path 114 may be sufficiently long that the length of the clock signal path 114 may be considered a delay element 110. The delay elements 110 of the clock signal path 114 may thus cause a clock signal, such as one of the multiple clock signals generated by the clock generator 104, propagating through the clock signal path 114 to experience a phase shift.

The path replicator 111 may be configured to replicate the delay of the clock signal path 114. For example, the path replicator 111 may include a first replica path 116a between an input 120 of the path replicator 111 and a node 118 of the path replicator 111. In some embodiments of the present disclosure, the input 120 may be included in the master block 101 and the node 118 may be included in the slave block 103. The first replica path 116a may include one or more delay elements 112 between the input 120 and the node 118 that may substantially match the delay elements 110 of the clock signal path 114. Accordingly, the delay associated with the first replica path 116a may be substantially the same as the delay associated with the clock signal path 114.

In the illustrated embodiment, the path replicator 111 may also include a second replica path 116b between the node 118 and an output 122 of the path replicator 111. The output 122 may be included in the master block 101. The second replica path 116b may also include one or more delay elements 113 between the node 118 and the output 122 that may substantially match the delay elements 110 of the clock signal path 114. Therefore, the second replica path 116b may have an associated delay that also is substantially the same as the delay associated with the clock signal path 114. As such, in the illustrated embodiment, the overall delay associated with the path replicator 111 may be approximately twice that of the delay associated with the clock signal path 114. In alternative embodiments, the first replica path 116a and the second replica path 116b may be configured such that the overall delay associated with the path replicator 111 may be substantially equal to the delay associated with the clock signal path 114.

The input 120 of the path replicator 111 may be configured to receive a reference clock signal. The reference clock signal may be any suitable clock signal that may have substantially the same frequency as the base clock signal. In the illustrated embodiment, the input 120 of the path replicator 111 may be configured to receive one of the multiple clock signals from the clock generator 104 as the reference clock signal. For example, the input 120 of the path replicator 111 may be configured to receive as the reference clock signal the first clock signal described in FIG. 1B. In other embodiments, the input 120 of the path replicator 111 may be configured to receive the base clock signal directly, or may be configured to receive any other suitable clock signal (e.g., the second, third, or fourth clock signal).

As the reference clock signal propagates through the path replicator 111, the reference clock signal may experience a delay, and an associated phase shift, such that a delayed reference clock signal may be output by the path replicator 111 at the output 122. The phase shift of the delayed reference clock signal at the output 122 with respect to the reference clock signal received at the input 120 may be associated with the phase shift experienced by a clock signal that may propagate through the clock signal path 114. For example, in the illustrated embodiment, the delay associated with the path replicator 111 may be approximately twice that of the delay associated with the clock signal path 114. Therefore, the phase shift of the delayed reference clock signal with respect to the reference clock signal may be twice that of the phase shift experienced by a clock signal that may propagate through the clock signal path 114, such as one of the multiple clock signals generated by the clock generator 104.

The phase detector 132 may be configured to receive the reference clock signal and the delayed reference clock signal. The phase detector 132 may be any suitable system, apparatus, or device configured to detect the phase difference between the reference clock signal and the delayed reference clock signal and output a control signal based on the detected phase difference. The control signal may be received by the selector circuit 106 and the selector circuit 106 may select one of the multiple clock signals as the slave clock signal for driving the logic circuit 131 of the slave block 103 based on the control signal.

The control signal and selector circuit 106 may be configured such that the slave clock signal may have a phase shift that may at least partially offset the phase shift associated with the delay of the clock signal path 114 to reduce the phase error between the slave clock signal and the master clock signal. Accordingly, the circuit 100 may be configured to synchronize the slave clock signal with respect to the master clock signal.

For example, a clock signal with a zero degree phase shift (e.g., the first clock signal of FIG. 1B) may be the master clock signal. Additionally, the delay associated with the clock signal path 114 may result in a positive phase shift of ninety degrees. Accordingly, the control signal and selector circuit 106 may be configured such that the selector circuit 106 may select as the slave clock signal one of the multiple clock signals that may have a negative phase shift that may be closest to ninety degrees (e.g., the second clock signal of FIG. 1B). The negative phase shift of the multiple clock signal selected as the slave clock signal may therefore at least partially offset the positive phase shift associated with the delay of the clock signal path 114. As such, the phase error between the slave clock signal and master clock signal may be reduced. Therefore, the circuit 100 may be configured to synchronize the master clock signal and the slave clock signal.

An implementation of the circuit 100 may depend on various design characteristics and constraints associated with the circuit 100. For example, the number of multiple clock signals generated by the clock generator 104 may vary depending on a desired granularity of adjustment of the phase of the slave clock signal. As way of example and not limitation, if the desired granularity of adjustment is ninety degrees, the clock generator 104 may generate the first, second, third, and fourth clock signals having a zero degree, ninety degree, one-hundred eighty degree and two-hundred degree phase shift, respectively. However, the clock generator 104 may be configured to generate more or fewer clock signals depending on whether more or less precision is desired.

Additionally, implementations of the circuit 100 may vary depending on the delay associated with the clock signal path 114. For example, if the delay is verified to cause a phase shift within a certain range, clock signals having phase shifts within the range may be used. Further, implementations of the circuit 100 may vary depending on the relationship of the delay associated with the path replicator 111 and the delay associated with the clock signal path 114. For example, if the delay associated with the path replicator 111 is approximately the same as or twice that of the delay associated with the clock signal path 114.

The following is an example associated with an implementation of the circuit 100 where the granularity of adjustment of the slave clock signal may be ninety degrees. In the present example, the delay associated with the clock signal path 114 may be verified to cause a positive phase shift that may be larger than forty-five degrees and less than two-hundred twenty-five degrees, and the delay associated with the path replicator 111 may be approximately twice that of the delay associated with the clock signal path 114.

For the present example, because the granularity of adjustment of the phase of the slave clock signal may be ninety degrees, the clock generator 104 may generate the first clock signal, the second clock signal, the third clock signal and/or the fourth clock signal of FIG. 1B. Additionally, the slave clock signal may be selected from one of the second clock signal and the third clock signal because the delay associated with the clock signal path 114 may be verified to cause a positive phase shift that may be larger than forty-five degrees and less than two-hundred twenty-five degrees. Accordingly, the selector circuit 104 may be configured to receive the second clock signal and the third clock signal from the clock generator 104. The selector circuit 104 may select one of the second clock signal and the third clock signal according to the control signal received from the phase detector 132.

In the present example, the phase detector 132 may be configured such that the control signal may be asserted "low" when the phase difference between the reference signal and the delayed reference signal indicates that the second clock signal with a negative ninety degree phase shift may be selected as the slave clock signal. The phase detector 132 may be configured such that the control signal may be asserted "high" when the phase difference between the reference signal and the delayed reference signal indicates that the third clock signal with a negative one-hundred eighty degree phase shift may be selected as the slave clock signal. Therefore, the selector circuit 104 may be configured to select the second clock signal as the slave clock signal when the control signal is asserted "low" and may be configured to select the third clock signal as the slave clock signal when the control signal is asserted "high."

Consequently, in the present example, to at least partially compensate for the positive phase shift associated with the clock signal path 114 that may be between forty-five and one-hundred thirty-five degrees, the control signal may be asserted "low." Additionally, to at least partially compensate for the positive phase shift associated with the clock signal path 114 that may be between one-hundred thirty-five degrees and two-hundred twenty-five degrees, the control signal may be asserted "high."

As mentioned above, in the present example, the delay associated with the path replicator 111 may be twice that of the delay associated with the clock signal path 114. Accordingly, the phase shift of the delayed reference clock signal with respect to the reference clock signal may be twice that of the phase shift experienced by a clock signal that may propagate through the clock signal path 114. Therefore, if the positive phase shift of the delayed reference clock signal with respect to the reference clock signal is greater than ninety degrees and less than or equal to two-hundred seventy degrees—corresponding with a positive phase shift associated with the clock signal path 114 of greater than forty-five degrees and less than or equal to one-hundred thirty-five degrees—the phase detector 132 may be configured to assert the control signal "low." Therefore, the second clock signal with a negative ninety degree phase may be selected as the slave clock signal, which may reduce the phase error between the slave clock signal and the master clock signal for the positive phase shift ranges associated with the clock signal path 114 that may be greater than forty-five degrees and less than or equal to one-hundred thirty-five degrees.

If the positive phase shift of the delayed reference clock signal with respect to the reference clock signal is greater than two-hundred seventy degrees and less than or equal to four-hundred fifty degrees—corresponding with a positive phase shift associated with the clock signal path 114 of greater than one-hundred thirty-five degrees and less than or equal to two-hundred twenty-five degrees—the phase detector 132 may be configured to assert the control signal "high." Therefore, the third clock signal with a negative one-hundred eighty degree phase may be selected, which may reduce the phase error between the slave clock signal and the master clock signal for the positive phase shift ranges associated with the clock signal path 114 that may be greater than one-hundred thirty five degrees and less than or equal to two-hundred twenty-five degrees.

Table 1 below lists some examples of a phase shift associated with the clock signal path 114 in degrees (depicted as "Phase 1"), a corresponding phase shift associated with the path replicator 111 (depicted as "Phase 2"), the assertion level (e.g., "low" depicted as "L" or "high" depicted as "H") of the control signal corresponding with Phase 1 and Phase 2, the phase shift that may be applied by selecting the second clock signal or the third clock signal as the slave clock signal (depicted as "Phase Shift"), and the phase error of the slave clock signal with respect to the master clock signal after at least partially compensating for the phase shift associated with the clock signal path 114 (depicted as "Phase Error").

TABLE 1

| Phase 1 | Phase 2 | Control Signal | Phase Shift | Phase Error |
|---------|---------|----------------|-------------|-------------|
| +67.5   | +135    | L              | −90         | −22.5       |
| +90     | +180    | L              | −90         | 0           |
| +112.5  | +225    | L              | −90         | +22.5       |
| +135    | +270    | L              | −90         | +45         |
| +157.5  | +315    | H              | −180        | −22.5       |
| +180    | +360    | H              | −180        | 0           |
| +202.5  | −+405   | H              | −180        | +22.5       |
| +225    | +450    | H              | −180        | +45         |

As depicted by Table 1, the phase error between the master clock signal and the slave clock signal (illustrated in the "Phase Error" column), may be less than the phase shift associated with the clock signal path 114 (illustrated in the "Phase 1" column). Therefore, the example implementation of the circuit 100 may better synchronize the master clock signal and the slave clock signal.

Figure 1C:
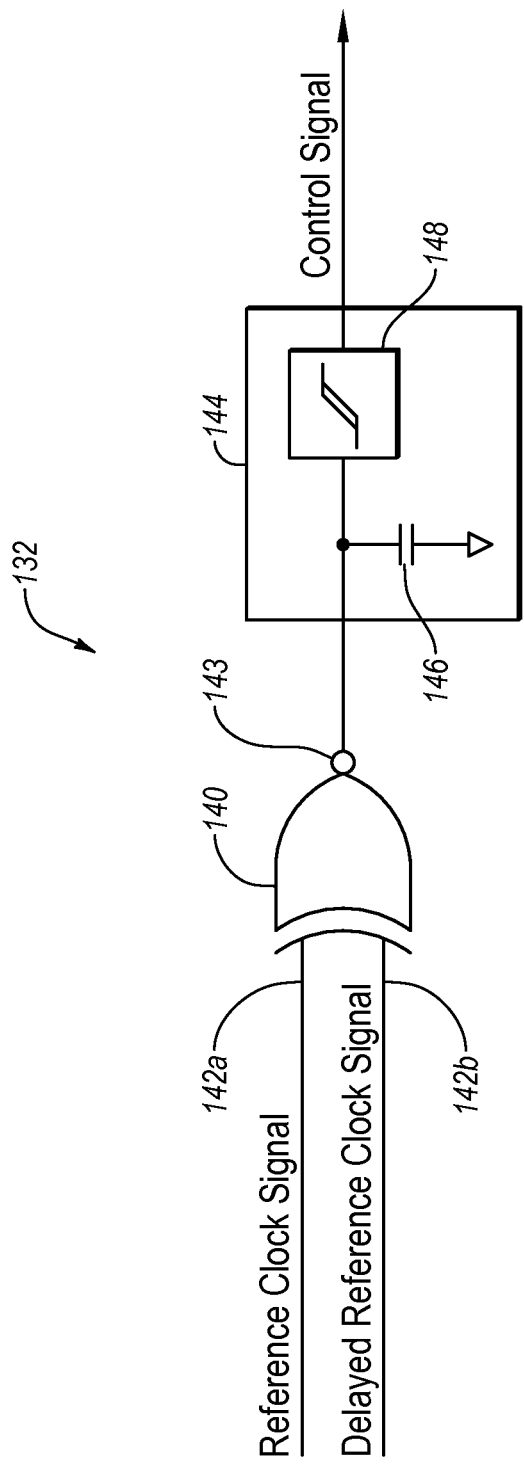
FIG. 1C illustrates an example embodiment of a phase detector of the circuit of FIG. 1A.

The phase detector 132 of the present example may be configured in any suitable manner such that the control signal is asserted "low" and "high" as described above for the current example. For example, in some embodiments, the phase detector 132 may include a negated exclusive OR (XNOR) gate and a low pass filter (LPF) configured such that the phase detector 132 asserts the control signal "high" and "low" as described above. FIG. 1C illustrates an example embodiment of the phase detector 132 that includes an XNOR gate 140 and an LPF 144, arranged in accordance with at least some embodiments described herein. The XNOR gate 140 may receive the reference clock signal at an input 142a and may receive the delayed reference clock signal at an input 142b. An output 143 of the XNOR gate 140 may be coupled to the LPF 144 such that the LPF 144 receives a signal output by the XNOR gate 140 at the output 143 of the XNOR gate 140.

The LPF 144 may be configured to output as the control signal, the signal at the output 143 that occupies more than half a cycle of the reference clock signal. If the logical levels of the reference clock signal and the delayed reference clock signal are opposite (e.g., one may be asserted "high" while the other may be asserted "low"), the signal at the output 143 of the XNOR gate 140 may be asserted "low." Additionally, when the phase shift of the delayed reference clock signal with respect to the reference clock signal is greater than ninety degrees and less than or equal to two-hundred seventy degrees, the reference clock signal and the delayed reference clock signal may have opposite logical levels more than fifty percent of the time. Therefore, in the present example, if the phase shift of the delayed reference clock signal with respect to the reference clock signal is greater than ninety degrees and less than or equal to two-hundred seventy degrees, the control signal may be asserted "low" because the signal received by the LPF 144 from the output 143 of the XNOR gate 140 may be asserted "low" more than fifty percent of the time.

Further, if the logical levels of the reference clock signal and the delayed reference clock signal are the same, the signal at the output 143 of the XNOR gate 140 may be asserted "high." Additionally, when the phase shift of the delayed reference clock signal with respect to the reference clock signal is greater than two-hundred seventy degrees and less than or equal to four-hundred fifty degrees, the reference clock signal and the delayed reference clock signal may have the same logical level more than fifty percent of the time. Therefore, if the phase shift of the delayed reference clock signal with respect to the reference clock signal is greater than two-hundred seventy degrees and less than or equal to four-hundred fifty degrees the control signal may be asserted "high" because the signal received by the LPF 144 from the output 143 of the XNOR gate 140 may be asserted "high" more than fifty percent of the time.

The LPF 144 may include any suitable system, apparatus or device configured to perform the operations described above. For example, in the illustrated embodiment, the LPF 144 may include a capacitor 146 configured to accumulate the logic level (e.g., "low" or "high") of the signal received from the output 143. Additionally, the LPF 144 may include a hysteresis circuit 148 configured to reduce the effects of noise and signal spikes that may be present at the output 143.

Therefore, the phase detector 132 that includes the XNOR gate 140 and LPF 144 of FIG. 1C may be used for an implementation of the circuit 100 described above where the granularity of adjustment of the slave clock signal may be ninety degrees; the delay associated with the clock signal path 114 may be verified to cause a positive phase shift that may be larger than forty-five degrees and less than two-hundred twenty-five degrees; and the delay associated with the path replicator 111 may be approximately twice that of the delay associated with the clock signal path 114.

Modifications, additions, or omissions may be made to the circuit 100 without departing from the scope of the present disclosure. For example, the above example implementation of the circuit 100 with respect to the specific design parameters given is merely for illustrative purposes, and other implementations of the circuit 100 are contemplated. Additionally, the terms "negative phase shift" and "positive phase shift" are used merely to provide a point of reference in the above description and are not limiting.

Further, the configuration of the circuit 100 may vary without departing from the scope of the present disclosure. For example, different combinations of the clock generator, 104, the phase detector 132 and/or the selector circuit 106 may be included in the master block 101 and/or the slave block 103 without departing from the scope of the present disclosure.

Figure 1D:
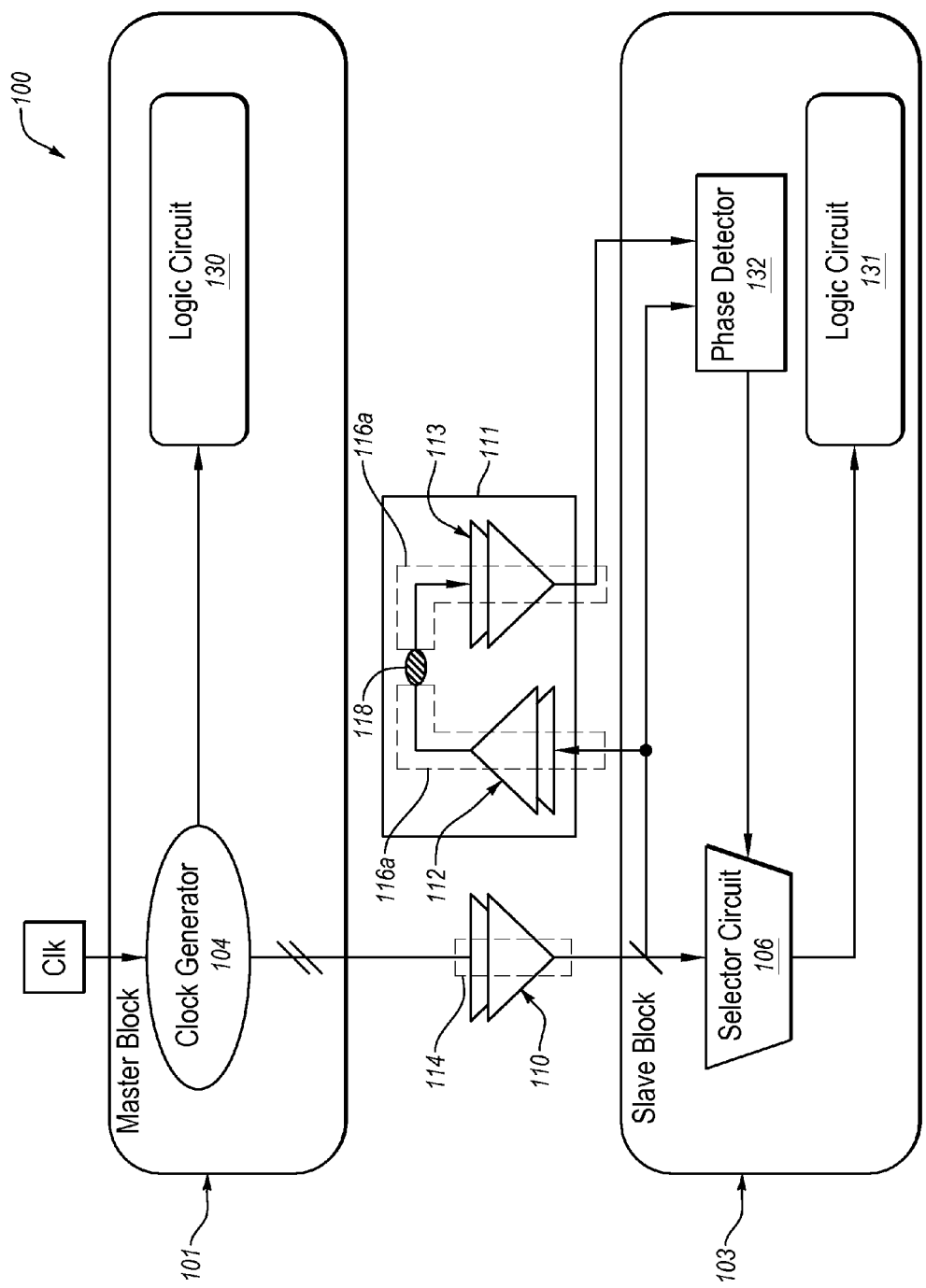
FIG. 1D illustrates an embodiment of the circuit of FIG. 1A in which the phase detector is included in a slave block of the circuit.

As way of example and not limitation, FIG. 1D illustrates an embodiment of the circuit 100 in which the phase detector 132 may be included in the slave block 103. In the example embodiment of FIG. 1D, the reference clock signal may be configured as one of the multiple clock signals generated by the clock generator 104. In the example embodiment of FIG. 1D, the reference clock signal may be received by the phase detector 132 and the path replicator 111 after the associated clock signal of the multiple clock signals has propagated through the clock signal path 114. In contrast, in the illustrated embodiment of FIG. 1A, the reference clock signal may be received by the phase detector 132 and the path replicator 111 before the associated clock signal has propagated through the clock signal path 114.

The phase detector 132 of the example embodiment in FIG. 1D may be configured to receive the reference clock signal from the clock signal path 114 and the delayed reference clock signal from the path replicator 111. As described above with respect to the example embodiment of FIG. 1A, the phase detector 132 in the example embodiment of FIG. 1D may be configured to determine the phase difference between the reference clock signal and the delayed reference clock signal and may output a control signal based on the detected phase difference. Additionally, as described above with respect to the example embodiment of FIG. 1A, the selector circuit 106 of the example embodiment of FIG. 1D may select one of the multiple clock signals as the slave clock signal based on the control signal received from the phase detector 132 such that a phase error between the master clock signal and the slave clock signal may be reduced. Therefore, the example embodiment of the circuit 100 depicted in FIG. 1D may synchronize clock signals in a circuit also.

Figure 2:
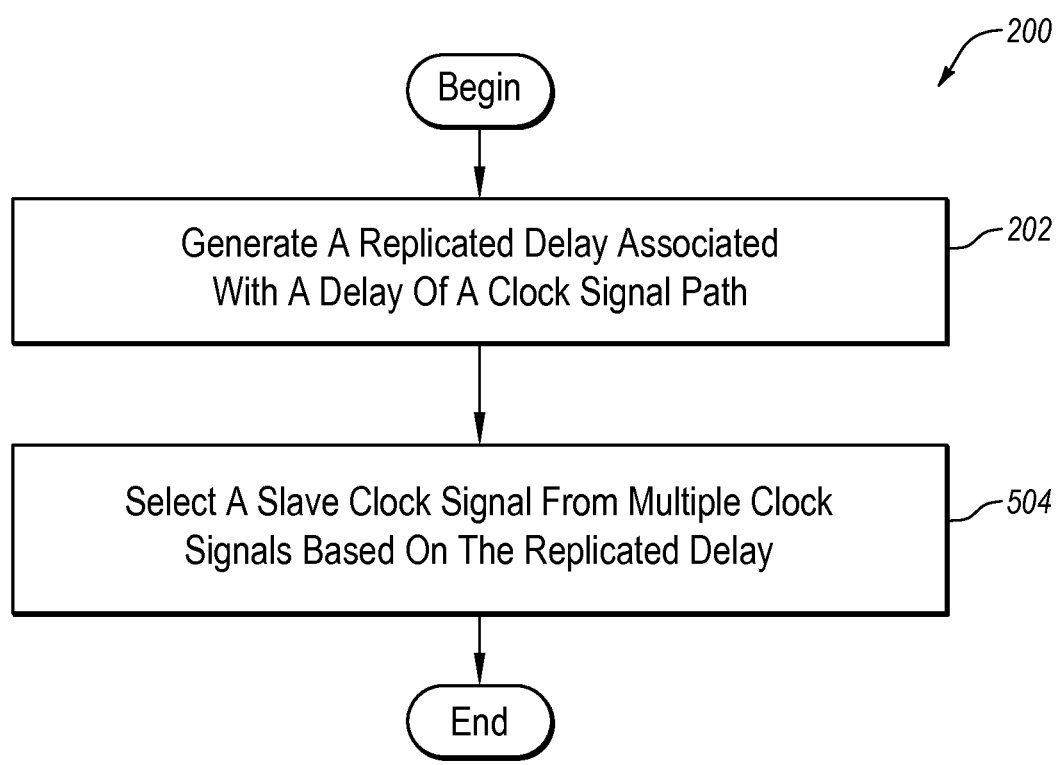
FIG. 2 is a flow chart of an example method of synchronizing clock signals.

FIG. 2 is a flow chart of an example method 200 of synchronizing clock signals, arranged in accordance with at least some embodiments described herein. The method 200 may be implemented, in some embodiments, by one or more components of an electronic circuit, such as the circuit 100 of FIG. 1A. For instance, the clock generator 104, the phase detector 132, the selector circuit 106 and the path replicator 111 of the circuit 100 may be configured to perform one or more operations of the method 200. Although illustrated as discrete blocks, various blocks may be divided into additional blocks, combined into fewer blocks, or eliminated, depending on the desired implementation.

The method 200 may begin at block 202, where a replicated delay associated with a delay of a clock signal path may be generated. The clock signal path may be associated with the communication of a slave clock signal by a master block of an electronic circuit to a slave block of the electronic circuit.

In block 204, the slave clock signal may be selected from one of multiple clock signals based on the replicated delay. In some embodiments, the selection may be made based on a phase difference between a reference clock signal and a delayed reference clock signal. The phase difference between the reference clock signal and the delayed reference clock signal may be associated with the replicated delay. The selection may be such that a phase error between a master clock signal (configured to drive the master block) and the slave clock signal may be reduced. Following the block 204, the method 200 may end. Therefore, the method 200 may synchronize clock signals of a circuit.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 200 may further include operations associated with generating a control signal to select the slave clock signal from one of the multiple clock signals. Additionally, the method 200 may include operations associated with generating the multiple clock signals.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the disclosure.

What is claimed is:

1. A circuit comprising:
a slave block;
a master block configured to communicate a slave clock signal to the slave block;
a clock signal path coupled to the master block and the slave block and configured to carry the slave clock signal from the master block to the slave block, the clock signal path including one or more clock delay elements coupled between the master block and the slave block and creating a clock delay within the clock signal path;
a path replicator including:
a first replica path coupled to the master block and the slave block, the first replica path including one or more first delay elements coupled between the master block and the slave block, the one or more first delay elements substantially matching the one or more clock delay elements such that the first replica path is configured to generate a first replicated delay substantially equal to the clock delay; and
a second replica path coupled to the first replica path, the master block and the slave block, the second replica path including one or more second delay elements coupled between the master block and the slave block, the one or more second delay elements substantially matching the one or more clock delay elements such that the second replica path is configured to generate a second replicated delay substantially equal to the clock delay; and
a selector circuit communicatively coupled to the second replica path and configured to select the slave clock signal from one of a plurality of clock signals based on the first replicated delay and the second replicated delay, each of the plurality of clock signals having a same frequency and a different phase.

2. The circuit of claim 1, wherein:
the path replicator is configured to receive a reference clock signal and output a delayed reference clock signal based on the first replicated delay and the second replicated delay; and
the selector circuit is configured to select the slave clock signal based on a phase difference between the reference clock signal and the delayed reference clock signal, the phase difference between the reference clock signal and the delayed reference clock signal being associated with the first replicated delay and the second replicated delay.

3. The circuit of claim 2, further comprising a phase detector communicatively coupled to the path replicator and the selector circuit and configured to detect the phase difference between the reference clock signal and the delayed reference clock signal.

4. The circuit of claim 3, wherein the phase detector comprises a negated exclusive OR (XNOR) gate and a low-pass filter.

5. The circuit of claim 3, wherein the phase detector is configured to generate a control signal based on the phase difference between the reference clock signal and the delayed reference clock signal.

6. The circuit of claim 2, wherein the selector circuit is configured to:
receive a control signal associated with the phase difference between the reference clock signal and the delayed reference clock signal; and
select the slave clock signal based on the control signal.

7. The circuit of claim 2, wherein the phase difference between the reference clock signal and the delayed reference clock signal is approximately twice that of a phase shift associated with the delay associated with the clock signal path.

8. The circuit of claim 1, further comprising a clock generator configured to generate the plurality of clock signals based on a base clock signal.

9. The circuit of claim 8, wherein the clock generator includes a phase interpolator.

10. A method of synchronizing clock signals comprising:
generating a first replicated delay substantially equal to a delay of a clock signal path coupled to a master block of a circuit and a slave block of the circuit, the clock signal path being associated with communication of a slave clock signal by the master block to the slave block and including one or more clock delay elements coupled between the master block and the slave block, the first replicated delay being generated by a first replica path coupled to the master block and the slave block, the first replica path including a same number of first replica delay elements as a number of the one or more clock delay elements, the first replica delay elements being coupled between the master block and the slave block and substantially matching the one or more clock delay elements such that the first replicated delay is substantially equal to the delay of the clock signal path;
generating a second replicated delay substantially equal to the delay of the clock signal path, the second replicated delay being generated by a second replica path coupled to the first replica path, the master block, and the slave block, the second replica path including a same number of second delay elements as the number of the one or more clock delay elements, the second delay elements coupled between the master block and the slave block and substantially matching the one or more clock delay elements such that the second replicated delay is substantially equal to the delay of the clock signal path; and
selecting the slave clock signal from one of a plurality of clock signals based on the first replicated delay and the second replicated delay, each of the plurality of clock signals having a same frequency and a different phase.

11. The method of claim 10, further comprising:
receiving a reference clock signal and outputting a delayed reference clock signal based on the first replicated delay and the second replicated delay; and
selecting the slave clock signal based on a phase difference between the reference clock signal and the delayed reference clock signal, the phase difference between the reference clock signal and the delayed reference clock signal associated with the first replicated delay and the second replicated delay.

12. The method of claim 11, further comprising detecting the phase difference between the reference clock signal and the delayed reference clock signal.

13. The method of claim 11, further comprising generating a control signal based on the phase difference between the reference clock signal and the delayed reference clock signal.

14. The method of claim 13, further comprising generating the control signal with a negated exclusive OR (XNOR) gate and a low-pass filter.

15. The method of claim 13, further comprising selecting the slave clock signal based on the control signal.

16. The method of claim 11, wherein the phase difference between the reference clock signal and the delayed reference clock signal is approximately twice that of a phase shift associated with the delay associated with the clock signal path.

17. The method of claim 10, further comprising generating the plurality of clock signals based on a base clock signal.

18. The method of claim 10, further comprising generating the plurality of clock signals with a phase interpolator.

19. A circuit comprising:
a slave block;
a master block configured to communicate a slave clock signal to the slave block;
a clock signal path coupled to the master block and the slave block and configured to carry the slave clock signal from the master block to the slave block, the clock signal path including one or more clock delay elements coupled between the master block and the slave block that result in a clock delay within the clock signal path;
a path replicator including:
a first replica path coupled to the master block and the slave block, the first replica path including a same number of first delay elements as a number of the one or more clock delay elements, the first delay elements coupled between the master block and the slave block and substantially matching the one or more clock delay elements such that the first replica path is configured to generate a first replicated delay substantially equal to the clock delay; and
a second replica path coupled to the master block and the slave block, the second replica path including a same number of second delay elements as the number of the one or more clock delay elements, the second delay elements coupled between the master block and the slave block and substantially matching the one or more clock delay elements such that the second replica path is configured to generate a second replicated delay substantially equal to the clock delay; and
a selector circuit communicatively coupled to the second replica path and configured to select the slave clock signal from one of a plurality of clock signals based on the first replicated delay and the second replicated delay, each of the plurality of clock signals having a same frequency and a different phase.

20. The circuit of claim 19, wherein:
the path replicator is configured to receive a reference clock signal and output a delayed reference clock signal based on the first replicated delay and the second replicated delay; and
the selector circuit is configured to select the slave clock signal based on a phase difference between the reference clock signal and the delayed reference clock signal, the phase difference between the reference clock signal and the delayed reference clock signal being associated with the first replicated delay and the second replicated delay.

* * * * *